United States Patent
Griffith, Jr. et al.

(10) Patent No.: US 9,499,674 B2
(45) Date of Patent: Nov. 22, 2016

(54) ANTI-REFLECTIVE FILM FOR PHOTOVOLTAIC ARRAYS

(71) Applicant: Rohm and Haas Company, Philadelphia, PA (US)

(72) Inventors: William B. Griffith, Jr., North Wales, PA (US); Edward La Fleur, Holland, PA (US); Edwin Hugh Nungesser, Horsham, PA (US)

(73) Assignee: Rohm and Haas Company, Philadelphia, PA (US)

( * ) Notice: Subject to any disclaimer, the term of this patent is extended or adjusted under 35 U.S.C. 154(b) by 0 days.

(21) Appl. No.: 14/774,222

(22) PCT Filed: Mar. 21, 2014

(86) PCT No.: PCT/US2014/031438
§ 371 (c)(1),
(2) Date: Sep. 10, 2015

(87) PCT Pub. No.: WO2014/160606
PCT Pub. Date: Oct. 2, 2014

(65) Prior Publication Data
US 2016/0024263 A1    Jan. 28, 2016

Related U.S. Application Data

(60) Provisional application No. 61/804,895, filed on Mar. 25, 2013.

(51) Int. Cl.
| | |
|---|---|
| *C08J 5/00* | (2006.01) |
| *C08J 5/18* | (2006.01) |
| *G02B 1/111* | (2015.01) |
| *H01L 31/0216* | (2014.01) |

(52) U.S. Cl.
CPC .................. *C08J 5/18* (2013.01); *G02B 1/111* (2013.01); *H01L 31/02168* (2013.01); *C08J 2423/12* (2013.01); *C08J 2433/08* (2013.01); *Y02E 10/50* (2013.01)

(58) Field of Classification Search
CPC .... C08J 5/18; C08J 2423/12; C08J 2433/08; G02B 1/111; H01L 31/02168; Y02E 10/50
See application file for complete search history.

(56) References Cited

U.S. PATENT DOCUMENTS

| | | | |
|---|---|---|---|
| 5,639,537 A | 6/1997 | Ebara et al. | |
| 7,604,866 B2 | 10/2009 | Ohashi et al. | |
| 7,768,602 B2 | 8/2010 | LaFleur et al. | |
| 7,829,626 B2 | 11/2010 | Chiou et al. | |
| 7,893,162 B2 * | 2/2011 | Lafleur et al. | C08L 25/06 252/182.11 |
| 8,436,096 B2 * | 5/2013 | LaFleur et al. | B82Y 20/00 525/191 |
| 8,778,492 B1 * | 7/2014 | LaFleur et al. | B82Y 20/00 252/582 |
| 2008/0050539 A1 | 2/2008 | Hamamatsu et al. | |
| 2012/0070656 A1 | 3/2012 | Chung et al. | |

* cited by examiner

*Primary Examiner* — Nathan M Nutter
(74) *Attorney, Agent, or Firm* — Kenneth Crimaldi

(57) ABSTRACT

A film containing polymeric particles which have an average particle diameter from 0.75 to 15 μm and a refractive index which changes continuously from the center of the particles to the surface. The particles are embedded in a continuous polymeric phase comprising a polyolefin. The average refractive index difference measured from 400 nm to 800 nm between the polymeric particles and the continuous polymeric phase is no greater than 0.02.

9 Claims, No Drawings

ANTI-REFLECTIVE FILM FOR PHOTOVOLTAIC ARRAYS

This invention relates to an anti-reflective film which is particularly useful for construction of photovoltaic modules.

There are a number of approaches to minimizing wasteful reflection of visible light from photovoltaic arrays, including application of a low dielectric constant layer onto the surface of the array. For example, U.S. Pat. No. 7,604,866 discloses a film comprising silica particles for this purpose. However, this and other approaches do not minimize surface reflections at the film-glass interface.

The problem addressed by the present invention is to provide an anti-reflective film which is particularly useful for construction of photovoltaic modules.

STATEMENT OF INVENTION

The present invention provides a film comprising polymeric particles having: (a) an average particle diameter from 0.75 to 15 µm; and (b) a refractive index which changes continuously from the center of the particles to the surface; and a continuous polymeric phase comprising a polyolefin; wherein an average refractive index difference measured from 400 nm to 800 nm between the polymeric particles and the continuous polymeric phase is no greater than 0.02.

DETAILED DESCRIPTION

Percentages are weight percentages (wt %) and temperatures are in ° C., unless specified otherwise. Refractive index (RI) values are determined at the sodium D line, where λ=589.29 nm at 20° C., unless specified otherwise. Polymeric particles comprise organic polymers, preferably addition polymers, and preferably are substantially spherical. Average particle diameter D50 is defined as the median value of the particle size distribution measured with a particle size analyzer, preferably a Coulter counter. $T_g$ values are calculated from homopolymer $T_g$ values using the Fox equation; see *Bulletin of the American Physical Society* 1, 3, page 123 (1956). The $T_g$ of a polymeric particle whose composition varies throughout the particle is the weight average of the $T_g$ values of the different compositions in the particle. Weight percentages of monomers are calculated for each stage of a multistage polymer based on the total weight of monomers added to the polymerization mixture in that stage. As used herein the term "(meth)acrylic" refers to acrylic or methacrylic, and "(meth)acrylate" refers to acrylate or methacrylate. The term "(meth)acrylamide" refers to acrylamide (AM) or methacrylamide (MAM). "Acrylic monomers" include acrylic acid (AA), methacrylic acid (MAA), esters of AA and MAA, itaconic acid (IA), crotonic acid (CA), acrylamide (AM), methacrylamide (MAM), and derivatives of AM and MAM, e.g., alkyl (meth)acrylamides. Esters of AA and MAA include, but are not limited to, alkyl, hydroxyalkyl, phosphoalkyl and sulfoalkyl esters, e.g., methyl methacrylate (MMA), ethyl methacrylate (EMA), butyl methacrylate (BMA), hydroxyethyl methacrylate (HEMA), hydroxyethyl acrylate (HEA), hydroxypropyl methacrylate (HPMA), hydroxybutyl acrylate (HBA), methyl acrylate (MA), ethyl acrylate (EA), butyl acrylate (BA), 2-ethylhexyl acrylate (EHA), cyclohexyl methacrylate (CHMA), benzyl acrylate (BzA) and phosphoalkyl methacrylates (e.g., PEM). "Styrenic monomers" include styrene, α-methylstyrene; 2-, 3-, or 4-alkylstyrenes, including methyl- and ethyl-styrenes; preferably styrene.

The term "vinyl monomers" refers to monomers that contain a carbon-carbon double bond that is connected to a heteroatom such as nitrogen or oxygen. Examples of vinyl monomers include, but are not limited to, vinyl acetate, vinyl formamide, vinyl acetamide, vinyl pyrrolidone, vinyl caprolactam, and long chain vinyl alkanoates such as vinyl neodecanoate, and vinyl stearate. The term "polyolefins" refers to polymers or copolymers of alkenes, preferably those having from two to ten carbon atoms, preferably two to eight carbon atoms, preferably two to four carbon atoms, preferably propylene or ethylene. Preferably, the continuous polymeric phase comprises at least 75 wt % polyolefin, preferably at least 85 wt %, preferably at least 95 wt %, preferably at least 98 wt %. Preferred polyolefins include copolymers of alkenes, especially of ethylene with other alkenes, preferably those having from three to eight carbon atoms; preferably the other alkenes are present in a total amount from 0-90 wt %, preferably 2-50 wt %, preferably 3-40 wt %. Preferably, weight-average molecular weight of the polyolefin is from 50,000 to 500,000, preferably from 70,000 to 300,000. Preferably, polyolefins have a glass transition temperature less than 25° C., preferably less than 10° C. Preferably, polyolefins have a melting temperature no greater than 200° C., preferably no greater than 190° C., preferably no greater than 180° C.; preferably the melting temperature is at least 100° C.

Preferably, the polymeric particles have an average particle diameter of at least 1 µm, preferably at least 1.5 µm, preferably at least 2 µm, preferably at least 2.5 µm, preferably at least 3 µm, preferably at least 3.5 µm; preferably, these particles have an average particle diameter no greater than 12 µm, preferably no greater than 10 µm, preferably no greater than 8 µm, preferably no greater than 6 µm, preferably no greater than 5.5 µm. Preferably, the polymeric particles have a particle size distribution indicating a single mode; preferably the width of the particle size distribution at half-height is from 0.1 to 3 µm, preferably from 0.2 to 1.5 µm. The film may contain particles having different average diameters provided that particles of each average diameter have a particle size distribution as described immediately above. The particle size distribution is determined using a particle size analyzer.

Refractive index differences stated herein are absolute values. Preferably, the refractive index difference (i.e., the absolute value of the difference) measured from 800 nm to 2500 nm between the polymeric particle and the continuous polymeric phase is at least 0.04, preferably at least 0.06, preferably at least 0.08, preferably at least 0.1. Preferably, the refractive index difference measured from 800 nm to 2500 nm between the polymeric particle and the continuous polymeric phase is no greater than 0.2, preferably no greater than 0.17, preferably no greater than 0.15. Preferably, the refractive index difference measured from 400 nm to 800 nm between the polymeric particle and the continuous polymeric phase is no greater than 0.015, preferably no greater than 0.01, preferably no greater than 0.005, preferably no greater than 0.003. Preferably, the refractive index of the polymeric particle is from 1.43 to 1.55, preferably from 1.45 to 1.53, preferably from 1.46 to 1.52, preferably from 1.47 to 1.51. Preferably, the refractive index of the continuous polymeric phase is from 1.4 to 1.6, preferably from 1.45 to 1.55, preferably from 1.47 to 1.53, preferably from 1.48 to 1.52. Preferably, the refractive index of the polymeric particle is greater than the refractive index of the continuous polymeric phase in the infrared region, i.e., from 800-2500 nm. The refractive index of a GRIN particle for purposes of calculating a refractive index difference is the refractive index at the particle surface.

The polymeric particle in the film is one having a radial refractive index gradient ("GRIN" particle, see, e.g., US 20090097123). Preferably, GRIN particles have a higher refractive index at the center than at the surface. Preferably, GRIN particles have a refractive index at the center from 1.51 to 1.63, preferably from 1.52 to 1.60, preferably from 1.53 to 1.59, preferably from 1.54 to 1.59; and a refractive index at the surface from 1.45 to 1.53, preferably from 1.46 to 1.52, preferably from 1.47 to 1.51. In another preferred embodiment, GRIN particles have a lower refractive index at the center than at the surface. GRIN particles may have a core derived from a polymer seed used to produce the GRIN particle. Preferably, the core of the GRIN particle is no more than 95 wt % of the particle, preferably no more than 80 wt %, preferably no more than 60 wt %, preferably no more than 40 wt % preferably no more than 20 wt %.

Preferably, the continuous polymeric phase comprises from 0.5 to 15 wt % of the polymeric particles, based on the weight of the entire film; preferably at least 1 wt %, preferably at least 1.5 wt %, preferably at least 2 wt %, preferably at least 3 wt %, preferably at least 5 wt %; preferably no more than 12 wt %, preferably no more than 10 wt %, preferably no more than 9 wt %. The continuous polymeric phase is continuous in the sense that there is an unbroken path connecting all parts of the polymer.

Preferably, the polymeric particles comprise at least 60% polymerized residues of acrylic monomers, preferably at least 65%, preferably at least 70%, preferably at least 75%, preferably at least 80%. Preferably, the polymeric particles comprise at least 70% polymerized residues of acrylic and styrenic monomers, preferably at least 80%, preferably at least 90%, preferably at least 95%, preferably at least 97%. Preferably, the polymeric particle also comprises 0 to 5% polymerized residues of acid monomers (e.g., AA, MAA, IA, CA), preferably 0.5 to 4% AA and/or MAA, and may also contain small amounts of residues of vinyl monomers.

Crosslinkers are monomers having two or more ethylenically unsaturated groups, or coupling agents (e.g., silanes) or ionic crosslinkers (e.g., metal oxides). Crosslinkers having two or more ethylenically unsaturated groups may include, e.g., divinylaromatic compounds, di-, tri- and tetra-(meth) acrylate esters, di-, tri- and tetra-allyl ether or ester compounds and allyl (meth)acrylate. Preferred examples of such monomers include divinylbenzene (DVB), trimethylolpropane diallyl ether, tetraallyl pentaerythritol, triallyl pentaerythritol, diallyl pentaerythritol, diallyl phthalate, diallyl maleate, triallyl cyanurate, Bisphenol A diallyl ether, allyl sucroses, methylene bisacrylamide, trimethylolpropane triacrylate, allyl methacrylate (ALMA), ethylene glycol dimethacrylate (EGDMA), hexane-1,6-diol diacrylate (HDDA) and butylene glycol dimethacrylate (BGDMA). Preferably, the amount of polymerized crosslinker residue in the polymeric particle is no more than 8%, preferably no more than 6%, preferably no more than 5%; preferably at least 0.1%, preferably at least 0.5%, preferably at least 1%, preferably at least 2%. Preferably, if crosslinkers are present, they have a molecular weight from 100 to 250, preferably from 110 to 230, preferably from 110 to 200, preferably from 115 to 160. Preferably, crosslinkers are difunctional or trifunctional, i.e., they are diethylenically or triethylenically unsaturated, respectively, preferably difunctional.

Preferably, the film comprising polymeric particles of the present invention is produced by extruding a mixture of the polyolefin and the polymeric particles. Preferably, the substrate for the film is glass, wood, leather or an optically clear plastic, e.g., poly(ethyleneterephthalate); preferably glass or an optically clear plastic, preferably glass. Preferably, the refractive indices of plastics and glasses for this application vary from a minimum of: 1.4 for (poly(vinylidene)fluoride to 1.8 for glass doped with thallium oxide ($Tl_2O$). The film samples can also be coated with an adhesive layer for the purpose of film-to-film lamination in a multilayer structure and improved contact with substrates.

Aqueous or solvent based acrylic polymers and resins of diverse functionality and molecular weight may be used to adhere multiple layers. Preferably, the adhesives are prepared from colloidal polymer dispersions in water and or solvents to yield solutions or suspension at high (30-50% w/w) solid content. Preferably, prior to application of adhesive, the substrate is treated by exposure to electric discharge for the purpose of reducing the surface energy and enhancing adhesion. Preferably, the adhesive coated substrate is dried at a temperature gradient, which ranges from 80 to 170° C., in a drying oven for 10 to 15 minutes.

Preferably, the adhesive compositions are prepared from a mixture of a low glass transition acrylic polymers (preferably Tg less than 25° C.) and an acrylic polymer in the form of a lightly crosslinked sphere in diameter ranging from a minimum of 0.85 μm to a maximum of 30 μm. Preferably, the acrylic polymer of the spheres is crosslinked; preferably the amount of polymerized crosslinker residue is between 4 and 20 percent overall. Preferably a first polymerization stage includes one or more of the following monomers: ethylene glycol diacrylate, propylene glycol diacrylate and tetramethylene glycol diacrylate. Preferably, a second stage includes between 4 and 20 percent of one or more of the following crosslinker moieties: diethylene glycol bis (ally carbonate), allyl methacrylate, ethylene glycol dimethacrylate, propylene glycol dimethacrylate and tetramethylene glycol dimethacrylate.

The adhesive compositions are designed to be applied to rough and smooth surfaces that are populated with large protrusions that restrict the complete coverage of the surface topography. The adhesive solvent borne solution or aqueous dispersion can be applied to a substrate in a variety of ways. Preferably, if the substrate is hard and populated with surface irregularities in the form of high aspect ratio particles, the adhesive is coated onto the surface with a gravure coater. Alternatively, the adhesive bead composition can be formulated with a variety of binders to create an aqueous or solvent based coating composition that can be applied (e.g., by spray or roller coating, jetting or printing) onto an appropriate substrate. The most efficient geometric arrangement of the dispersed particles is a single layer of spheres on the substrate is one in which the particles are in a face centered cubic or hexagonal close packing arrangement.

When the adhesive bead compositions are applied in the form of an aqueous dispersion, preferred binders include such coating agents as amino silane, epoxy, epoxy silane, alkyl silane, fatty acid or silicon oil. The preferred amino silane is aminoethylaminopropyltrimethoxysilane and cellulose acrylate solution. Other suitable aqueous binders include (co)polymers chosen from acrylic, vinyl, such as vinyl acetate or vinyl acetate-ethylene, polyurethanes, siloxanes, natural rubbers, synthetic rubber polymers, such as styrene-butadiene (SBR) block copolymers, protein polymers, cellulosic polymers and mixtures and combinations thereof, for example, acrylic urethanes.

Where the bead compositions are solvent-stable, the adhesive compositions can be applied by solvent casting. The solvents used in solvent casting include methyl ethyl ketone, methyl isobutyl ketone, ethyl acetate, butyl acetate, toluene, isopropanol, ethyl alcohol and xylene and toluene.

The adhesive compositions may also include any or all of the following: preservatives, antioxidants, glyceryl ester of hydrogenated wood rosin, corn or potato starch, ethylene glycol, trimethylene glycol, tetramethylene glycol, pentamethylene glycol, hexamethylene glycol, propylene glycol, glycerine, 2,3-butanediol, 1,3-butanediol, diethylene glycol, triethylene glycol, polyethylene glycol, ethylene urea, urea, sorbitol and mannitol. A tackifying resin such as rosin and terpene phenol may also be added to the blend compositions.

Alternately, the adhesive can be based on copolymers of alpha polyolefins and ethylene. Formulations that are tackified with hydrogenated hydrocarbon tackifers are preferred. Adhesive formulation may silanes to improve adhesion to glass surfaces. In some embodiments the films can be in multiple layer structure such that one layer can be peeled away presenting a new surface. In this embodiment it is preferred that each layer be less than 100 um in thickness, preferably less than 50 μm in thickness and that the total number of layers be greater than 2, preferably greater than 3, preferably greater than 5, preferably greater than 7. In the embodiment of a multiple layer configuration it is preferred that an adhesive layer be present between that films. It is preferred that an average refractive index difference measured from 400 nm to 800 nm between the film and the adhesive is no greater than 0.02, preferably no greater than 0.01, preferably no greater than 0.005. It is preferable that the adhesive layer be less than 50 μm dry thickness, preferably less than 20 μm dry thickness.

Preferably, the total thickness of the film, whether or not it consists of multiple layers, is from 10 μm to 2 mm, preferably from 15 μm to 2 mm, preferably from 20 μm to 1.5 mm.

Preferably, the polymeric particles are prepared in an aqueous medium by known emulsion polymerization techniques, followed by spray drying of the resulting polymer latex. Spray drying typically results in clumps of polymeric particles having an average diameter of 1 to 15 μm. Preferably, these clumps are dispersed directly, without size reduction, into a polymer comprising a polyolefin to produce the film by a melt compounding process in an extruder, preferably at an extrusion temperature from 190 to 250° C., preferably from 195 to 240° C., preferably from 200 to 230° C.

EXAMPLES

The GRIN particles were isolated from the aqueous medium by spray drying.

Comparative Example 1

Plates are prepared by melt extrusion process from pellets of the neat polymer resin. The polypropylene resin (Huntsman Reyen, RI=1.49, Tg −10° C., Tm 173° C.) melt processed in a Leistritz extruder at barrel temperature ranging from 200 to 225° C. The melt compounding was followed by pelletization, drying, at 60° C. in a vacuum oven, and injection molding at temperatures between 221 and 236° C. The test plates derived from injection molding are of the following dimension: 66.9 mm×66.9 mm×1.5 mm. These plates were evaluated by, ASTM D 10003-00 (Standard test method for haze and luminous transmittance of transparent plastics) and ASTM E 313-00 (Standard practice for calculating yellowness and whiteness indices from instrumentally measured color coordinates). The data are given in TABLE I below.

Example 2-4

Plates are prepared by melt extrusion process from a mixture of the GRIN particles and a polymer resin. The GRIN particles (RI=1.56-1.49 and particle size diameter equal 0.75 μm) prepared by the polymerization process outlined below and of the composition: p((Benzyl acrylate/ALMA=76/4)//MMA/EA=16/4) was dry blended with polypropylene resin (Huntsman Reyen, RI=1.49) followed by melt compounding in a Leistritz extruder at barrel temperature ranging from 200 to 225° C. The melt compounding used a special screen pack arrangement, 80/120/300/120/80 mesh, to produce ultimate dispersion of the GRIN particles. The melt compounding was followed by pelletization, drying, at 60 C in a vacuum oven, and injection molding at temperatures between 221 and 236° C. The test plates derived from injection molding are of the following dimension: 66.9 mm×66.9 mm×1.5 mm. These plates were evaluated by, ASTM D 10003-00 (Standard test method for haze and luminous transmittance of transparent plastics) and ASTM E 313-00 (Standard practice for calculating yellowness and whiteness indices from instrumentally measured color coordinates). The data are given in TABLE I below.

Examples 5-7

Plates are prepared by melt extrusion process from a mixture of the GRIN particles and a polymer resin. The GRIN particles (RI=1.56-1.59 and particle size diameter equal 0.80 μm) prepared by the polymerization process outlined below and of the composition: p((Benzyl acrylate/ALMA=76/4)//Styrene=20) was dry blended with polypropylene resin (Huntsman Reyen, RI=1.49) followed by melt compounding in a Leistritz extruder at barrel temperature ranging from 200 to 225° C. The melt compounding used a special screen pack arrangement, 80/120/300/120/80 mesh, to produce ultimate dispersion of the GRIN particles. The melt compounding was followed by pelletization, drying at 60 C in a vacuum oven, and injection molding at temperatures between 221 and 236° C. The test plates derived from injection molding are of the following dimension: 66.9 mm×66.9 mm×1.5 mm. These plates were evaluated by, ASTM D 10003-00 (Standard test method for haze and luminous transmittance of transparent plastics) and ASTM E 313-00 (Standard practice for calculating yellowness and whiteness indices from instrumentally measured color coordinates). The data are given in TABLE II below.

Example 8

Pre-Seed Polymer

This example illustrates the preparation of crosslinked polymer pre-seeds of 0.25 μm in diameter for making large seed particles in aqueous dispersion. The following mixtures A-C were prepared with deionized water:

| Mixture | Component | Parts by Weight |
|---|---|---|
| A1 | Water | 180 |
| | Sodium Carbonate | 0.40 |
| B1 | n-Butyl Acrylate | 98.0 |
| | Allyl Methacrylate | 1.75 |
| | 1,4-Butanediol Diacrylate | 0.25 |
| | 22.5% aqueous Sodium Dodecylbenzenesulfonate | 2.22 |
| | Water | 40.8 |
| C1 | Sodium Persulfate | 0.06 |
| | Water | 11.9 |

A reactor equipped with stirrer and condenser and blanked with nitrogen was charged with Mixture A1 and heated to 83° C. To the reactor contents was added 10% of emulsified Mixture B1 and 25% of Mixture C1. The temperature was maintained at 83° C. and the mixture was stirred for 60 minutes, after which the remaining Mixture B1 and Mixture C1 were added to the reactor with stiffing over a period of 120 minutes. Stirring was continued at 83° C. for 90 minutes, after which the reactor contents were cooled to room temperature. The particle size of the resulting particle pre-seeds was 0.25 µm as measured by a Brookhaven Instruments particle size analyzer BI-90.

Example 9

Polymer Seeds

In this example the pre-seed particles in the emulsion of Example 8 are grown to 0.56 µm diameter using n-butyl acrylate, styrene, and 1-hexanethiol. The following mixtures A2-G2 were prepared with deionized water:

| Mixture | Component | Parts by Weight |
|---|---|---|
| A2 | Sodium Carbonate | 0.08 |
| | 9.76% aqueous Sodium Dodecylbenzenesulfonate | 0.01 |
| | Water | 156.00 |
| B2 | 30.10% aqueous emulsion from Example 8 | 29.80 |
| C2 | n-Butyl Acrylate | 81.80 |
| | Styrene | 18.20 |
| | 9.76% aqueous Sodium Dodecylbenzenesulfonate | 4.53 |
| | Water | 57.50 |
| D2 | 1-Hexanethiol | 18.80 |
| | 9.76% aqueous Sodium Dodecylbenzenesulfonate | 0.58 |
| | Water | 15.00 |
| E2 | Sodium Persulfate | 0.11 |
| | Water | 47.40 |
| F2 | t-Butyl Hydroperoxide 70% | 0.30 |
| | Water | 15.00 |
| G2 | Sodium Formaldehyde Sulfoxylate | 0.20 |
| | Water | 6.67 |

Mixture A2 was added to the reactor of Example 8 and heated to 88° C. with stirring. The air in the reactor was replaced by nitrogen. When the reactor temperature stabilized at 88° C., Mixture B2 was charged into the reactor. Emulsified Mixtures C2 and D2, and Mixture E2 were then added to the reactor, with stirring, over a period of 300 minutes. Stirring was continued at 88° C. for 90 minutes. The reactor contents were cooled to 65° C. Mixtures F2 and G2 were added and the reactor contents were maintained at 65° C. with stirring for 1 hour, after which the reactor contents were cooled to room temperature. The resulting emulsion particles had a diameter of 0.56 µm as measured by a Brookhaven Instruments particle size analyzer BI-90.

Example 10

GRIN Sphere Composition

In this example, the particles in the emulsion of Example 9 are expanded to create 5 µm diameter divergent lenses using n-butyl acrylate and ally methacrylate in Stage I which is then followed by Stage II copolymerization of methyl methacrylate and ethyl acrylate. The following mixtures A3-G3 were prepared with deionized water:

| Mixture | Component | Parts by Weight |
|---|---|---|
| Stage I | | |
| A3 | Water | 138.50 |
| B3 | Aqueous emulsion from Example 2 at 29.88% solids | 0.105 |
| C3 | n-Butyl Acrylate | 76.80 |
| | Allyl Methacrylate | 3.20 |
| | 10% aqueous Sodium Dodecylbenzenesulfonate | 0.28 |
| | Water | 33.12 |
| D3 | t-Butyl Peroctoate | 0.427 |
| | 10% aqueous Sodium Dodecylbenzenesulfonate | 0.003 |
| | Water | 2.96 |
| Stage II | | |
| E3 | Methyl Methacrylate | 19.20 |
| | Ethyl Acrylate | 0.80 |
| F3 | Sodium Formaldehyde Sulfoxylate | 0.062 |
| | Water | 6.67 |
| | 10% aqueous Sodium Dodecylbenzenesulfonate | 0.017 |
| G3 | t-Butyl Hydroperoxide 70% | 0.089 |
| | Water | 10.05 |
| | 10% aqueous Sodium Dodecylbenzenesulfonate | 0.037 |

To the reactor of Example 8 was added A3 which was heated to 90° C. with stiffing. The air in the reactor was replaced by nitrogen. When the reactor temperature stabilized at 90° C., Mixture B3 was charged into the reactor. Mixture C3 was emulsified with a homogenizer and charged into the reactor. The reactor was stirred at 60° C. for 1 hour. Mixture D3 was emulsified with a homogenizer and charged into the reactor. After 1 hour agitation at 60° C., the reactor was gradually heated to 65-70° C. while an exothermic polymerization takes place. After reach peak temperature, agitation was continued while the reactor was cooled to 73° C. in 30 minutes. Charge half of Mixture F3. Mixtures E3, the remainder of F3, and G3 were then separately added into the reactor over a period of 2 hours. The temperature was maintained between 73-75° C. and stirring was continued for 1 hour before the reactor was cooled to room temperature. The resulting emulsion particles, had a diameter of 5 µm as measured by a Coulter Corporation Multisizer IIE particle size analyzer.

Example 11

Plain Sphere Composition

In this example, the particles in the emulsion of Example 9 are expanded to create 5 μm diameter converging lenses using methyl methacrylate and ally methacrylate. The following mixtures A3-C3 were prepared with deionized water:

| Mixture | Component | Parts by Weight |
|---|---|---|
| | Stage I | |
| A3 | Water | 138.50 |
| | Aqueous emulsion from Example 2 at 29.88% solids | 0.105 |
| B3 | Methyl Methacrylate | 76.80 |
| | Allyl Methacrylate | 3.20 |
| | 10% aqueous Sodium Dodecylbenzenesulfonate | 0.28 |
| | Water | 33.12 |
| C3 | t-Butyl Peroctoate | 0.427 |
| | 10% aqueous Sodium Dodecylbenzenesulfonate | 0.003 |
| | Water | 2.96 |

To the reactor of Example 1 was added A3 which was heated to 60° C. with stiffing. The air in the reactor was replaced by nitrogen. When the reactor temperature stabilized at 60° C., Mixture B3 was charged into the reactor. Mixture C3 was emulsified with a homogenizer and charged into the reactor. The reactor was stirred at 60° C. for 1 hour. Mixture D3 was emulsified with a homogenizer and charged into the reactor. After 1 hour agitation at 60° C., the reactor was gradually heated to 80° C. while an exothermic polymerization takes place. After reaching peak temperature, 88° C. agitation was continued until polymerization showed >92% conversion. After polymerization, the reactor was cooled to 73° C. in 30 minutes. The temperature was maintained between 73-75° C. and stirring was continued for 1 hour before the reactor was cooled to room temperature. The resulting emulsion particles had a diameter of 5 μm as measured by a Coulter Corporation Multisizer IIE particle size analyzer.

The 5 micron spheres, obtained from the polymerization schemes described above, were analyzed by interference microscopy with the aid of the Zeiss Jenaval Interference microscope (250-CF Series JENA). From the interference fringes, the variation of refractive index with the radius of each sphere was accurately determined and depicted above. Particles produced using the same seed particle swelling/polymerization process described herein having an average particle size of 2 μm have been analyzed using a Zeiss Jenaval Interphako Interference Microscope as described above with well known experimental techniques to determine the refractive index from the center to the surface of the particles. One of ordinary skill in the art would expect the smaller particles produced by the same seed particle swelling/polymerization process to exhibit the same gradual change in refractive index property and would recognize that the refractive index profile exhibited by a given particle of having an average diameter of 0.3 to 1.9 μm can be determined indirectly based on the refractive index profile exhibited by a 5 μm particle produced by the same method and having the same composition.

TABLE I

Optical properties of blends of Polypropylene (PP) with GRIN particles

| EX. | Comp. (PP:GRIN) | L | a | b | Haze | Tt | YI | Brightness |
|---|---|---|---|---|---|---|---|---|
| 1 | 100:00 | 96.4 | 0.22 | 2.17 | 62.3 | 93.59 | 4.17 | 90.69 |
| 2 | 99.5:0.50 | 96.72 | 0.04 | 2.98 | 74.48 | 93.54 | 5.53 | 89.59 |
| 3 | 99:1.00 | 95.25 | −0.14 | 5.01 | 81.67 | 90.72 | 9.29 | 84.19 |
| 4 | 98.5:1.50 | 93.54 | −0.06 | 5.86 | 84.00 | 87.50 | 11.14 | 79.98 |

TABLE II

Optical properties of blends of Polypropylene with GRIN particles

| EX. | Comp. (PP:GRIN) | L | a | b | Haze | Tt | YI | Brightness |
|---|---|---|---|---|---|---|---|---|
| 5 | 99.5:0.50 | 96.34 | 0.11 | 3.86 | 81.94 | 92.81 | 7.24 | 87.71 |
| 6 | 99:1.00 | 93.26 | 0.14 | 5.64 | 85.26 | 86.98 | 10.91 | 79.77 |
| 7 | 98.5:1.50 | 90.67 | 0.20 | 6.27 | 86.05 | 82.22 | 12.51 | 74.42 |

Tt is percent transmission of visible light (measured according to ASTM D 10003-00).

YI is yellowness index (measured according to ASTM E 313-00)

Haze was measured according to ASTM D 10003-00

The invention claimed is:

1. A film comprising 0.5 to 15 wt % of polymeric particles having: (a) at least 70 wt % polymerized residues of acrylic monomers; (b) an average particle diameter from 0.75 to 15 µm; and (c) a refractive index which changes continuously from the center of the particles to the surface; and a continuous polymeric phase comprising at least 85 wt % of a polyolefin which is a polymer or copolymer of alkenes having from two to eight carbon atoms; wherein an average refractive index difference measured from 400 nm to 800 nm between the polymeric particles and the continuous polymeric phase is no greater than 0.02.

2. The film of claim 1 in which the average particle diameter is from 1.5 to 10 µm.

3. The film of claim 2 in which the polymeric particles have a refractive index from 1.45 to 1.53.

4. The film of claim 3 in which the refractive index at the center of the polymeric particles is from 1.52 to 1.60 and the refractive index at the surface is from 1.46 to 1.52.

5. The film of claim 4 in which the continuous polymeric phase comprises from 1 to 12 wt % of the polymeric particles.

6. The film of claim 5 in which the average particle diameter is from 2 to 8 µm.

7. The film of claim 6 in which the polymeric particles comprise at least 80 wt % polymerized residues of acrylic and styrenic monomers.

8. The film of claim 7 in which the continuous polymeric phase comprises from 1 to 9 wt % of the polymeric particles.

9. The film of claim 8 in which the continuous polymeric phase comprises at least 95 wt % polypropylene.

* * * * *